April 26, 1966 J. S. CUBERT 3,248,571

LOGIC CURCUIT

Filed Aug. 7, 1963 3 Sheets-Sheet 1

INVENTOR
JACK SAUL CUBERT

BY J. Donald Weber Jr.

AGENT

April 26, 1966 J. S. CUBERT 3,248,571

LOGIC CURCUIT

Filed Aug. 7, 1963 3 Sheets-Sheet 2

United States Patent Office 3,248,571
Patented Apr. 26, 1966

3,248,571
LOGIC CIRCUIT

Jack S. Cubert, Willow Grove, Pa., assignor to Sperry Rand Corporation, New York, N.Y., a corporation of Delaware Filed Aug. 7, 1963, Ser. No. 300,438
12 Claims. (Cl. 307—88.5)

This invention relates to a circuit which performs the OR logic function. More particularly, the logic function is a non-inverting operation and the circuit utilizes tunnel diodes and stored-charge diodes.

In the design and manufacture of many types of electronic systems, for example large scale computers and other electronic data processing equipment, a large number of logic circuits are required. These logic circuits include the AND, NOR and OR logic functions. Other logic functions may be desired but those enumerated are the most common. One of the major breakthroughs in the design of this electronic equipment has been the Enhanced-Tunnel-Diode (ETD) circuit. In this type of circuit, a tunnel diode is used as the switching element from which output signals having two distinct levels may be obtained and a storage diode, or enhanced diode, is used as the control element. That is, whether or not switching current is applied to the tunnel diode is controlled by the storage diode.

A plurality of logic circuits using the ETD design have been produced. The instant circuit performs the non-inverting OR-logic function and uses ETD principles. That is, the application of an input signal to the circuit will enhance the storage diode (i.e. store charge therein) such that a reverse current pulse may subsequently be passed therethrough in response to the application of a clock signal. This reverse current pulse is applied to the tunnel diode such that the operating condition of the tunnel diode may be switched. In the absence of an input signal, the applied clock signal will not be applied to the tunnel diode. Thus, an output signal is produced only in response to the application of an input signal. This is typical of OR logic operation. Of course, by properly interconnecting a plurality of the circuits, a network may be produced which provides additional operating advantages such as multi-level logic operation, or the like.

It will be seen that one object of this invention is to provide a high-speed, OR-logic circuit.

Another object of this invention is to provide a high-speed tunnel diode OR circuit which has high gating capabilities and is compatible with other tunnel diode logic circuits.

Another object of this invention is to provide a high-speed, OR-logic circuit utilizing the current gain of storage diodes and the high speed switching of tunnel diodes.

Another object of this invention is to provide a high-speed, non-inverting, multi-level, tunnel diode logic circuit.

Another object of this invention is to provide a logic circuit which performs AND-OR logic functions in one clock time.

These and other objects and advantages of the subject circuit will become more readily apparent when the following description is read in conjunction with the attached drawings, in which.

Figure 1:
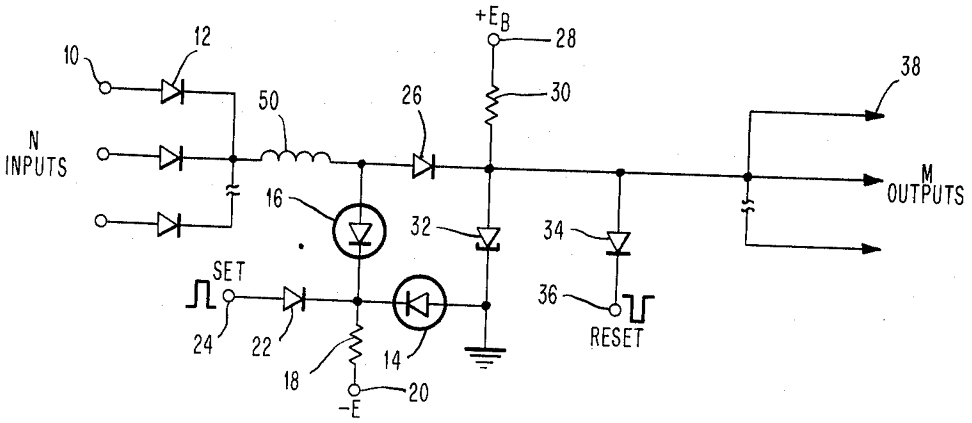
FIGURE 1 is a schematic diagram of a basic embodiment of a non-inverting, OR-logic circuit.

In referring to the drawings, similar components in the several drawings have the same last two digits. However, for convenience the first digit of the reference numerals (with the exception of FIGURE 1) is similar to the number of the figure in which the element appears. Referring now to FIGURE 1, the input sources 10, each of which may be any conventional type of input source including a tunnel diode driving circuit or the like, are connected to the anodes of input diodes 12. There are N inputs where N is a function of, and limited by, the fan-in, fan-out characteristics of the circuits utilized. An input diode 12 may be any type of high speed rectifier diode which exhibits little or no charge storage capabilities, for example an International Diode ID5-050 diode. The cathodes of input diodes 12 are connected to one terminal of inductor 50 which may be on the order of 0.5 nanohenries. The inductor 50 provides isolation between the inputs 10 and a clock source 24 and may, in fact, be eliminated if the question of isolation is not critical. In many cases, the self-inductance of a connecting lead between the cathodes of diodes 12 and an anode of a storage diode 16 is sufficient to provide this isolation and a separate inductance is unnecessary. The cathode of storage diode 16, which may be any type of diode which exhibits charge storage capabilities, as for example a General Electric CSD 686 type diode, is connected to one terminal of resistor 18 which may be on the order of 4700 ohms. Another terminal of resistor 18 is connected to a source 20. Source 20 may be any conventional type of substantially constant potential source which is capable of supplying approximately −8 volts with respect to ground potential unless otherwise designated, potential values, where given, are with respect to ground potential. Also connected to the cathode of storage diode 16 is the cathode of diode 14 which, in some applications, may be a storage diode similar to diode 16 or, in the alternative, may be a rectifier diode having a high reverse impedance. In the latter case, diode 14 would not conduct the reverse current, $I_R$ (see dashed line in FIGURE 2). The anode of diode 14 is connected to a suitable potential source, for example, ground. The cathode of a rectifier diode 22 is connected to the cathodes of diodes 14 and 16. Diode 22 may be any type of rectifier diode, preferably a high speed switching diode which exhibits little or no charge storing capabilities, for example, a Fairchild FD-600. The anode of diode 22 is connected to source 24 which may be any conventional type of source capable of supplying periodically recurring pulses, and, in the preferred embodiment, is a regularly recurring clock pulse source. The pulses supplied may have a base value of approximately zero volts and a peak magnitude of approximately +3.0 volts. Connected to the anode of storage diode 16 is the anode of diode 26. Diode 26 is a high speed switching rectifier diode exhibiting little or no charge storage capabilities similar to diode 22. The cathode of diode 26 is connected to the anode of tunnel diode 32. Tunnel diode 32 may typically be an RCA 1N3129 tunnel diode which has a peak current value of approximately 20 milliamperes. The cathode of tunnel diode 32 is connected to a suitable potential source, for example, ground. Also connected to the anode of tunnel diode 32 is one terminal of resistor 30 which may be approximately 250 ohms. Another terminal of resistor 30 is connected to source 28 which may be any conventional type of source capable of supplying a substantially constant potential on the order of about +4 volts. The combination of source 28 and resistor 30 produces a substantially constant current which is supplied to the tunnel diode such that the tunnel diode is biased for bistable operation. Also connected to the anode of tunnel diode 32 is the anode of diode 34 which has the cathode thereof connected to source 36. Diode 34 may be similar to the other high-speed rectifier diodes in the circuit. Source 36 may be any type of source capable of supplying periodic pulses which are negative going with respect to ground and which, in the embodiment described, are regularly recurring and have a base potential of approximately zero volts and a peak magnitude of approximately −3.0 volts. The outputs 38 are also connected to the anode of tunnel diode 32. As shown, there are M outputs where M is determined by the fan-in, fan-out capabilities of this tunnel diode circuit.

Figure 2:
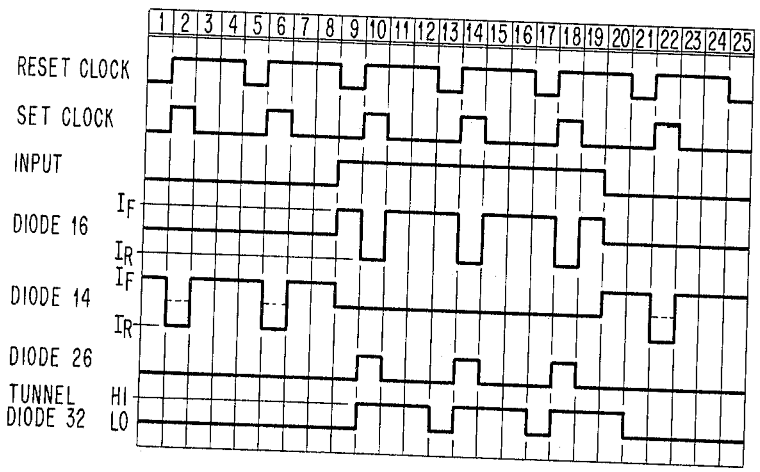
FIGURE 2 is a timing diagram for the circuit shown in FIGURE 1.

The operation of the circuit of FIGURE 1 may be more readily understood when the timing diagram shown in FIGURE 2 is described concurrently. The reset clock source 36 provides a regularly recurring, negative going signal that immediately precedes the set clock signal. Thus, the tunnel diode 32 will be reset to the low voltage operating condition immediately prior to the application of set clock signals whereby the remote possibility of an inadvertent signal spuriously switching the tunnel diode to the high voltage operating condition is eliminated.

In preferred embodiments, the input signal may be applied by a clocked input circuit such that the input signals are synchronized with the clocking of the instant circuit. However, for purposes of general application, this limitation is not imposed here and it is assumed that the input signal supplies sufficient charging current to the storage diodes. As shown in FIGURE 2, the input signal is a low level signal between time periods T1 and T8. This low level input signal which, if assumed to be supplied by a preceding tunnel diode circuit, may be on the order of +50 millivolts. Inasmuch as the input diodes 12, if germanium, require a potential drop thereacross of at least 250 millivolts before any substantial current conduction occurs, diodes 12 are effectively reverse biased. That is, diode 14 effectively clamps the cathode of diode 16 at a potential of about −600 millivolts. This potential is insufficient to cause conduction of the series circuit comprising diodes 12 and 16. Therefore, the cathodes of diodes 12 are effectively clamped at a potential less than ground but greater than −600 millivolts, for example about −100 millivolts. This assures that the diodes 12 will be cut off. Furthermore, since storage diode 16 is effectively cut off, no forward current ($I_F$) flows therethrough and the charge stored therein is negligible, at best. However, a forward current ($I_F$) exists in diode 14, which is shown and described as a storage diode, inasmuch as the anode thereof is grounded and the cathode thereof is returned to the negative potential source 20. Because of this forward current flow through storage diode 14, charge is stored therein. With the subsequent application of a clock signal by set clock source 24 at time periods T2 and T6, the positive going signal is passed via diode 22 to storage diode 14. Because of the stored charge therein, storage diode 14 is capable of conducting a reverse current ($I_R$) as shown in FIGURE 2 at time periods T2 and T6. Thus, the clock signal supplied at time periods T2 and T6 passes through storage diode 14, in the reverse direction, to ground. Therefore, no signal is applied to the tunnel diode 32 which remains in the low level operating condition. If, as suggested supra, diode 14 is not a storage diode but rather is a rectifier diode with high reverse impedance, the clock signal still does not pass through cut-offed storage diode 16 but is effectively dissipated through the source 20.

At time period T9, the input signal supplied by at least one of the sources 10 switches to the high level. This high level signal, which is assumed to be supplied by a preceding tunnel diode circuit, is on the order of +450 millivolts which is sufficiently high to turn on the input diodes 12. The potential drop which exists across any of diodes 12, when conducting, is on the order of 250 to 300 millivolts. Therefore, the potential at the cathodes of diodes 12 and the anodes of storage diode 16 and rectifier diode 26 rises to approximately +150 to +200 millivolts. It will be seen, incidentally, that this potential is not sufficient to switch the diode 26, especially inasmuch as the cathode thereof is maintained at a potential of approximately +50 millivolts by the tunnel diode 32. However, the increased potential at the anode of storage diode 16 causes forward current conduction therethrough. This conduction also raises the potential at the cathode of diodes 16 and 14 such that diode 14 is effectively cut off because of the fixed potential level at the anode of diode 14. Thus, with the application of a high level input signal, forward current flows through diode 16 thereby storing charge therein and diode 14 is cut off whereby no charge is stored therein. With the subsequent application of the set clock signal by source 24 at time periods T10, T14 and T18, reverse current ($I_R$) passes through storage diode 16. The clock pulse which is approximately +3.0 volts is large enough that, in spite of the potential drops across diodes 22 and 16, the potential at the anode of diode 26 is increased sufficiently to permit conduction therethrough. At the same time, because of the high-speed of the switching signals permitted by diode 16, the harmonic content of the signal is sufficient to cause inductor 50 to exhibit a very large impedance such that feedback through diodes 12 is avoided. (Of course, as noted supra, inductor 50 may be eliminated if feedback is not a problem.) Since diode 26 is conducting a positive going signal, the potential at the anode of tunnel diode 32 increases to about +1.5 volts and the current therethrough increases sufficiently to cause tunnel diode 32 to switch to the high voltage operating condition. When the tunnel diode has switched, the potential at the anode thereof is at least +450 millivolts, even after the clock pulse is terminated, such that output signals may be derived at any of the outputs 38.

At time periods T9, T13 and T17 the reset clock source 36 supplies a negative going signal which assures that tunnel diode 32 remains in, or is driven to, the low voltage operating region. At these times tunnel diode 32 is switched to the low voltage operating condition. The subsequent application of a clock signal by source 24 causes tunnel diode 32 to switch to the high voltage operating condition in response to reverse current flow through storage diode 16 and coupling diode 26.

At time period T20, the input signal again assumes the low level and diodes 12 are effectively cut off. Therefore, forward current through storage diode 16 ceases and charge is not stored therein. When storage diode 16 is cut off, the potential at the cathode thereof falls sufficiently so that storage diode 14 can now conduct forward current and store charge therein. Thus, the application of the clock signal at time period T22 merely causes reverse current flow through diode 14 to ground and tunnel diode 32 remains in the low voltage operating condition.

Thus, in the absence of a high level input signal, the clock signal is dissipated through storage diode 14 (or to sink 20) and tunnel diode 32 remains in the low voltage operating region. On the contrary, however, with the application of a high level input signal by any of sources 10, the storage diode 16 conducts forward current and stores charge therein while diode 14 is cut off. With the subsequent application of a set clock signal, reverse current flows through storage diode 16 and the current pulse is applied to tunnel diode 32 to switch the operating condition thereof. Thus, when any one of the inputs is high, the output signal is high, and when all of the inputs are low, the output signal remains low. This is non-inverting, OR logic operation.

Figure 3:
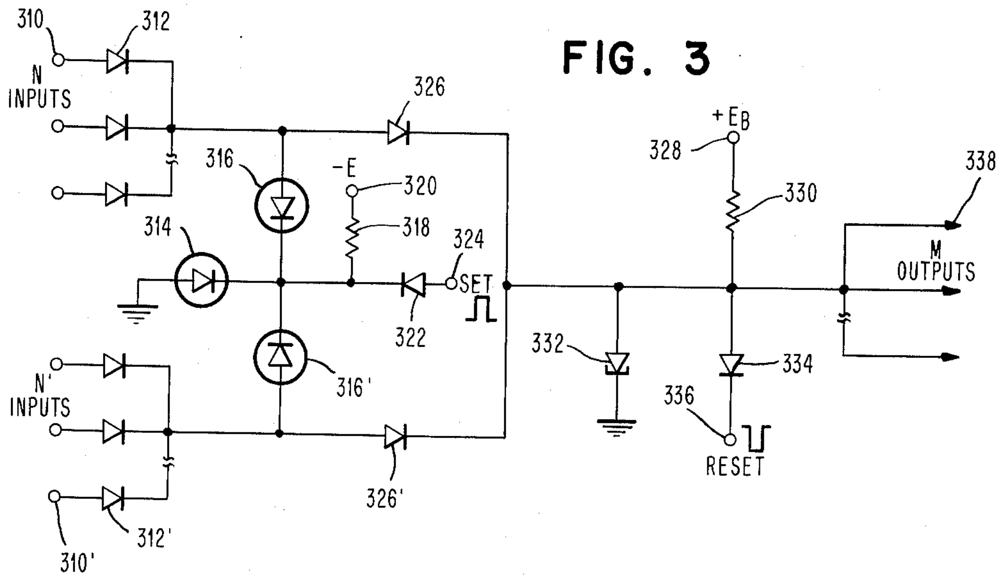
FIGURE 3 is a schematic diagram of an embodiment of a multi-level, non-inverting logic circuit.

Referring now to FIGURE 3, there is shown a further embodiment of the invention. This embodiment provides a multilevel, non-inverting circuit and has the advantage that a plurality of input networks are connected to a single tunnel diode. Components which are similar to components shown previously have the last two digits thereof identical. Similarly, components which are similar in FIGURE 3 but which relate to different phases, or the like, have a prime (′) affixed thereto. In this circuit, there are N input sources 310 where N is limited or defined by the operating characteristics of the circuit. Each of the inputs 310 is connected to the anode of an input coupling diode 312 which is a high-speed-switching, rectifier diode having little or no storage capabilities. The cathodes of these diodes are connected to the anode of storage diode 316 which may be any type of storage diode which stores charge therein in response to a forward current therethrough. The cathode of storage diode 316 is connected to one terminal of resistor 318 another terminal of which is connected to source 320. Source 320 is similar to source 20 described in FIGURE 1 and is capable of supplying a substantially constant negative potential. Also connected to the cathode of storage diode 316 is the cathode of a high-speed-switching rectifier diode 322 which has the anode thereof connected to the set clock source 324 which is capable of supplying a recurring, positive-going signal. Diode 314, which is shown and described as a storage diode capable of storing charge in response to forward current therethrough but which may be a rectifier diode, has the anode thereof connected to a suitable potential source, for example ground, and the cathode thereof connected to the cathode of storage diode 316. The high-speed-switching rectifier diode 326 has the anode thereof connected to the anode of storage diode 316 and the cathode thereof connected to the anode of tunnel diode 332. The cathode of tunnel diode 332 is connected to a suitable potential source, for example ground. The substantially constant current supplying means comprising potential source 328 (which is any source capable of supplying a substantially constant potential) and resistor 330 is connected to the anode of tunnel diode 332 in order to bias the tunnel diode for bistable operation. The high-speed-switching rectifier diode 334 has the anode thereof connected to the anode of tunnel diode 332 and the cathode thereof connected to the reset clock source 336 which is any type of source capable of supplying a regularly recurring, negative going signal. The M outputs 338 are connected to the anode of tunnel diode 332. This single logic circuit, as described, is substantially identical to the circuit described in FIGURE 1. In addition, this circuit includes the N′ inputs 310′ (where N′ is a function of the operating characteristics of the circuit as well as the input circuit). Input sources 310′ are connected to the anodes of diodes 312′ which are identical to diodes 312. The cathodes of diodes 312′ are connected to the anode of storage diode 316′ which is identical to storage diode 316. The cathode of storage diode 316′ is connected to the cathodes of storage diodes 316 and 314. The high-speed coupling diode 326′ which is identical to diode 326 has the anode thereof connected to the anode of storage diode 316′ and the cathode thereof connected to the anode of tunnel diode 332.

Figure 4:
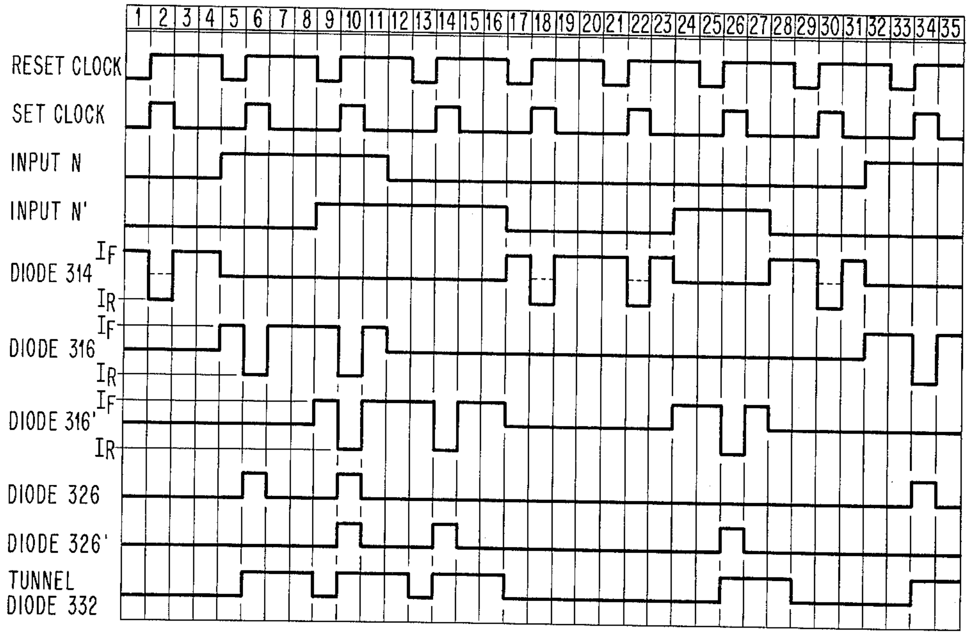
FIGURE 4 is a timing diagram for the circuit shown in FIGURE 3.

The operation of each of the phases or networks combined in this embodiment is identical to the operation of the circuit shown in FIGURE 1. However, for convenience, the timing diagram of FIGURE 4 is utilized in describing the operation of the circuit of FIGURE 3. The set clock and reset clock signals supplied by sources 324 and 336 are identical to those produced by sources 24 and 36 in the circuit shown in FIGURE 1. Again, the repetition rate, levels, and the like, are not meant to be limitative of the invention, but rather are presented only for purposes of description. Thus, the input signals supplied by sources 310 are all shown as low signals during time periods T1 through T4 and those supplied by input sources 310′ are low during time periods T1 through T8. Therefore, no forward current flows through the storage diodes 316 or 316′ during time periods T1 through T4. During this time, forward current ($I_F$) flows through diode 314 and charge is stored therein. Consequently, the clock signal applied by source 324 at time period T2 is dissipated as reverse current through diode 314 and tunnel diode 332 remains in the low level operating condition where it was operating in accordance with the reset clock signal applied by source 336 at time period T1. Of course, even if diode 314 was not a storage diode and reverse current ($I_R$) did not flow therethrough (see dashed lines FIGURE 4), the lack of reverse curent through diode 316 produces the same result.

However, at time period T5 the input signal supplied by one of the input sources 310 becomes a high level input signal and remains as such until time period T12. In response to the high level input signal, one of diodes 312 conducts and the potential at the anode of storage diode 316 is increased such that forward current ($I_F$) is conducted therethrough. With the conduction of forward current therethrough, the storage diode 316 stores charge therein and is now capable of passing a reverse current in response to the application of a clock signal by source 324.

Since the input signal supplied by one of the input sources 310 is high, forward current ($I_F$) flows through diode 316 during time periods T5 through T11 with the exception of time periods T6 and T10 when positive going set clock signals are applied by source 324. At time periods T6 and T10, the positive going signal is passed through diode 322 to storage diode 316 (which has had charge stored therein) such that reverse current ($I_R$) is passed through diode 316 to diode 326. The current signal is applied to tunnel diode 332 via diode 326 whereby the tunnel diode is switched from the low voltage operating condition to the high voltage operating condition. This change is then detected at any of the M output terminals 338.

At time period T12, the input signals supplied by the input sources 310 all assume the low level and remain low until time period T32 at which time the input signal supplied by one or more of the sources 310 becomes a high level signal and remains high. Thus, forward current again flows through storage diode 316 after time period T32 except during time period T34 at which time a clock pulse is applied by source 324. The clock pulse produces reverse current through storage diode 316 and a signal is applied, via diode 326, to tunnel diode 332 such that the tunnel diode is switched to the high voltage operating region. With the application of the reset clock signals, for example at time periods T9 and T13, the tunnel diode is reset to the low voltage operating condition.

There is no forward current through storage diode 316′ until the input signal supplied by one of sources 310′ switches from the low level to the high level, as for example at time period T9. After switching low at time period T16, the input signal supplied by at least one of sources 310′ again switches high at time period T24 and remains such until time period T27. Thus, forward current exists in storage diode 316′ during time periods T9 through T16 and during time periods T24 through T27, with the exception of time periods T10, T14 and T26. At these latter time periods, clock pulses supplied by source 324 cause current flow through diode 322 and reverse current flow through storage diode 316′. This current is then passed, via diode 326′, to tunnel diode 332 such that the tunnel diode is switched to the high voltage operating condition.

Thus, it will be seen that the clock pulses at time periods T6 and T34 produce high level output signals at tunnel diode 332 in response to the application of a high level input signal at one or more of the input sources 310. Similarly, a high level output signal is produced in response to the set clock signals at time periods T14 and T26 which signals are supplied coincidentally with a high level input signal supplied by any of the sources 310'. Furthermore, a high level signal is produced by the application of the clock signal at time period T10 in response to a high level signal supplied by at least one of the sources 310 and any one or more of the sources 310'. Thus, it is clear that if any of the input sources of any of the phases or logic levels supplies a high level input signal, a high level output signal is produced. Similarly, if all of the input sources supply low level input signals, a low level output signal is produced. Therefore, the non-inverting, OR-logic operation of this circuit is exhibited regardless of the number of phases or logic levels which are interconnected. This feature permits the usage of more inputs for a single tunnel diode.

Figure 5:
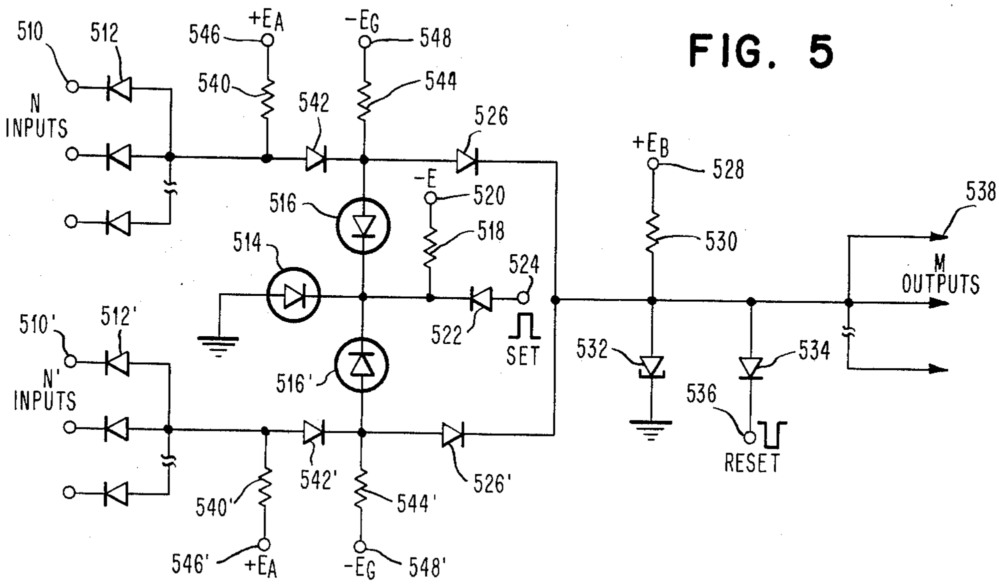
FIGURE 5 is a schematic diagram of another embodiment of a multi-level, non-inverting logic-circuit similar to that shown in FIGURE 3.

Referring now to FIGURE 5, there is shown a further embodiment of this invention. Again, in this figure, components which are similar to those previously described have the same last two digits. It will be seen that for the most part, this embodiment is similar to the embodiment shown in FIGURE 3. That is, the storage diodes, the clocking sources and the tunnel diodes are all similarly connected. However, the arrangement of the input circuit, or network, has been altered. Again, this circuit may be driven by tunnel diode circuitry which produces positive going input signals. The reason for the circuit alteration is to provide AND-OR logic with high fan-in capabilities with no increased tunnel diode requirements. Moreover, by providing the multi-level logic within the same clocking requirements, the effective speed of the circuit is increased. The modifications in the circuit shown in FIGURE 5 include the reversal of the input diodes and the addition of a biasing network. More specifically, the N input sources 510 are connected to the cathodes of the input diodes 512. The anodes of the input diodes 512 are connected to one terminal of resistor 540 which may be on the order of 4700 ohms. Another terminal of resistor 540 is connected to source 546 which may be any conventional source capable of supplying a substantially constant potential of approximately +19 volts. This source-and-resistor combination is selected to provide a substantially constant current source capable of supplying approximately 1 to 2 milliamperes. Also connected to the anodes of diodes 512 is the anode of diode 542. The cathode of diode 542 is connected to the anode of storage diode 516. Diode 542 may be any high-speed-switching rectifier diode similar to those previously discussed and described. Also connected to the cathode of diode 542 is one terminal of resistor 544 which may be on the order of 4700 ohms. Another terminal of resistor 544 is connected to source 548 which may be any conventional source capable of supplying a substantially constant potential of approximately —8.2 volts. The combination of source 548 and resistor 544 is effective to provide a bias potential and current to diode 542 such that this diode is biased near to, but below, the knee in the characteristic curve thereof. That is, without more, diode 542 is biased in the "OFF" condition or low conduction condition but near the knee of the curve such that high conduction may be established easily by the application of a small (properly biased) signal thereto. Similarly, the N' inputs 510' are connected to the cathodes of the input diodes 512' the anodes of which are connected to one terminal of resistor 540'. Another terminal of resistor 540' is connected to source 546'. The coupling diode 542' has the anode thereof connected to the anodes of input diodes 512' and the cathode thereof connected to the anode of storage diode 516'. The bias network comprising source 548' and resistor 544' is connected to the cathode of diode 542'. Coupling diode 526', a high speed rectifier diode, is connected between the anodes of storage diode 516' and tunnel diode 532 with the polarity thereof such that signals are passed only to the tunnel diode.

The operation of the circuit shown in FIGURE 5 is substantially similar to the operation of the circuit shown in FIGURE 3. However, because of the modifications in the circuit configuration, certain modifications or changes in the operation of the circuit are evident. If the input supplied by any of the sources 510 (or 510') is a low level input, then current will flow from source 546 (or 546') through resistor 540 (or 540') and through the input diode 512 (or 512') which is connected to the source supplying the low level signal. Thus, the current supplied by the constant current source will be dissipated in the input circuit having a low level signal. Since the diode 542 (or 542') is biased in the low conduction stage by the bias network associated therewith, little or no forward current exists in the storage diode 516 (or 516'). Therefore, with the application of a set clock pulse by source 524, the previously forward conducting storage diode 514 is capable of dissipating a reverse current pulse therethrough. Thus, tunnel diode 532 will remain in the low level operating condition.

On the contrary, if all of the inputs supplied by sources 510 or 510' are high level signals, each of the diodes 512 or 512' is reverse-biased. Thus, the current supplied by the respective constant current sources, i.e. source 546 and resistor 540 or source 546' and resistor 540', will flow through the diodes 542 or 542' such that forward current exists in storage diodes 516 or 516'. With the application of a clock signal by source 524, either or both of the storage diodes 516 and 516' which have previously had forward current therethrough such that charge was stored therein, are now capable of passing a reverse current pulse therethrough. The reverse current pulse produces a current pulse through coupling diode 526 or 526' such that tunnel diode 532 is switched to the high level operating condition. Thus, the non-inverting OR-logic function is performed by each phase or logic level of the circuit. In addition, the input diodes 512 or 512' form a gate which performs the AND logic operation for high signals such that an effective AND-OR logic system is provided.

Figure 6:
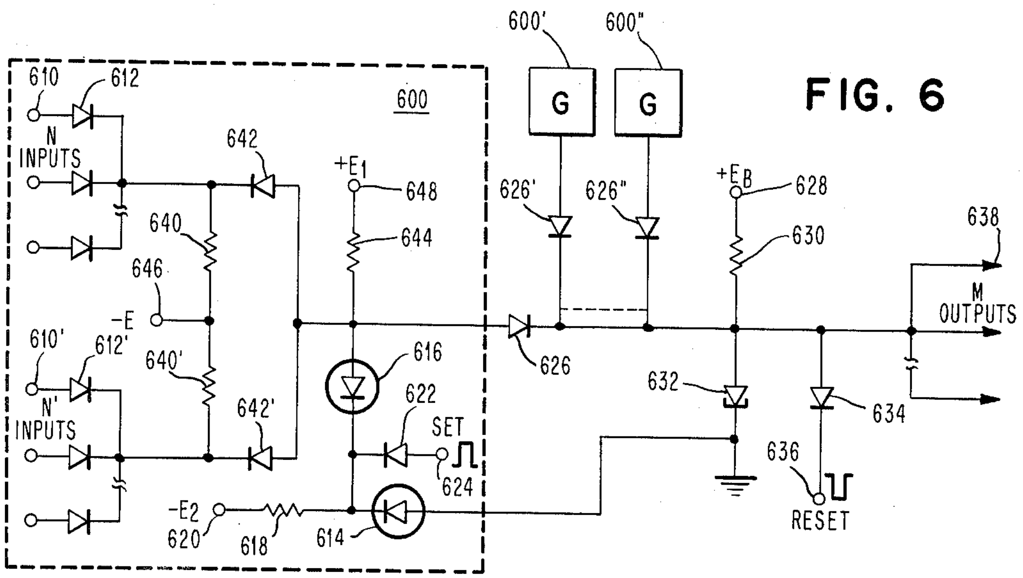
FIGURE 6 is a schematic diagram of further multi-level, non-inverting tunnel diode logic circuit which provides both AND and OR logic operation.

Referring now to FIGURE 6, there is shown a schematic diagram of another embodiment of this invention. In this embodiment, components which are similar to those previously described bear reference numerals having similar last two digits. In this embodiment, the AND-OR logic operation is achieved with a relatively few components. In addition, the number of logic levels for a given clock rate is increased. This increase in logic levels effectively produces an increase in the logic speed per gate. While reducing the number of components required, this multilevel embodiment permits the utilization of a stored charge injection period which is equivalent to that of a single level circuit. In addition to the advantages gained by the circuit, certain requirements are made in order to provide successful limitation thereof. For example, it is necessary that two levels of diode logic can be performed with the available tunnel diode swing between the different operating states thereof and that the charge storage diode current, when it is conducting, is sufficient to provide the necessary drive to the output tunnel diode. However, these requirements are well within the limitations of the components and technology presently available.

The configuration of this circuit is similar to the circuit configuration of the preceding embodiments. However, instead of having two logic-levels which are separate inasmuch as they are connected to different storage diodes or switching controls, the logic levels in this embodiment are connected together. That is, a plurality of AND logic circuits are connected together to form an OR logic circuit which is connected to a single charge storage diode. Thus, the gate shown within the dashed line 600 comprises the N inputs 610 which are connected to the input diodes 612 (forming one AND gate) at the anodes thereof. The cathodes of the input diodes are connected to the cathode of coupling diode 642. Also connected to the cathodes of the diodes is one terminal of resistor 640 another terminal of which is connected to source 646 which supplies a substantially constant negative potential. Similarly, the N′ inputs 610′ are connected to the anodes of the input diodes 612′ (forming another AND gate). The cathodes of diodes 612′ are connected to the cathode of coupling diode 642′. The cathodes of the diodes 612′ and 642′ are connected to one terminal of resistor 640′ another terminal of which is connected to source 646. The source 646 and respective resistors 640 and 640′ provide bias sources such that diodes 642 and 642′ are biased slightly beyond the knee of the characteristic curve, in the high conduction condition. The anodes of diodes 642 and 642′ are connected together at the anode of storage diode 616. Also connected to the anode of storage diode 616 is the current source comprising potential source 648 and resistor 644 which supplies about 1 or 2 milliamperes. This portion of the circuit is substantially similar to the input portion of the circuit shown in FIGURE 5 with the exception that the polarities of the diodes and the potential sources are reversed. If the polarities of the diodes were to be reversed, then the polarities of the sources would also have to be reversed and would be similar to that shown in FIGURE 5.

Also included in the gating circuit shown within dashed lines 600 is the remainder of the control circuit. The cathode of storage diode 616 is connected to the cathode of storage diode 614 the anode of which is connected to a suitable potential source, for example ground. Again, as noted supra, diode 614 need not be a storage diode but is so shown and described. The clock source 624 is connected to the cathode of storage diode 616 via diode 622. The current sink comprising negative potential source 620 and resistor 618 is also connected to the cathodes of the diodes 616, 622 and 614. The coupling diode 626 has the anode thereof connected to the anode of storage diode 616 and the cathode thereof connected to the anode of tunnel diode 632. A substantially constant current source comprising potential source 628 and resistor 630 is connected to the tunnel diode to bias the tunnel diode for bistable operation. The reset network comprising source 636 and diode 634 is connected to the anode of tunnel diode 632 along with the M outputs 638. The operation of the gating circuit shown within the dashed line 600 is similar to the operation of the previously described circuits. That is, when any one of the inputs 610 or 610′ is a high level signal, the associated diode 642 or 642′ (or both) is reverse biased. When the coupling diodes 642 or 642′ are reverse biased, the current supplied by the current source comprising potential source 648 and resistor 644 supplies forward current ($I_F$) through storage diode 616 such that charge is stored therein. In addition, the potential at the cathode of diode 614 is raised such that diode 614 is cut off and charge is not stored therein. With the subsequent application of a clock signal, reverse current flow exists in diode 616 such that current passes through diode 626 to tunnel diode 632. This current switches the operating condition of tunnel diode 632 from the low level condition to the high level condition. Contrariwise, when all of the inputs 610 and 610′ are low level signals, all of diodes 612 and 612′ are reverse biased. Thus, either coupling diode 642 or 642′ (or both) is now forward biased and may conduct current therethrough. Thus, the current supplied by the current source comprising the potential source 648 and resistor 644 passes through the pertinent coupling diode and the associated resistor to the current sink 646. Under these conditions, no forward current passes through storage diode 616 whereby charge is not stored therein. However, forward current passes through storage diode 614 such that when the clock pulse is applied, reverse current passes through diode 614 to ground and the tunnel diode 632 is not affected. Thus, it is seen that the circuit provides AND-OR logic operation inasmuch as the N or N′ input gates perform the AND logic operation and the combination thereof (effectively at the anode of storage diode 616) forms the OR logic function.

To indicate the versatility and flexibility of this particular circuit, additional gates 600′ and 600″ are shown. Each of these logic gates is defined to include the circuitry shown within the dashed line 600, or some similar combination thereof. Each of the gates is connected to the anode of the tunnel diode 632 via the respective coupling diode 626′ or 626″. By this showing, it is suggested that a large plurality of AND gates may be connected together by a large plurality of OR gates each of which is connected to a single tunnel diode and capable of controlling the state thereof. Thus, multi-level logic operations may be performed in parallel and simultaneously within the same clocking period such that the effective speed of operation of this circuit is increased while the number of required components remains small.

It is to be understood, of course, that by changing the polarities of the diodes or the sources shown in any of the embodiments, modifications may be made in the operation of the circuit, as for example modifications may be made upon the levels of the input and output signals such that negative-going signals may be substituted for positive-going signals. Further modifications in components or component values may be suggested to those skilled in the art; however, these modifications are meant to be included within the scope of this description so long as the basic principles thereof are followed. That is, the specific configurations and components shown are used to suggest preferred embodiments and are not meant to limit the scope of this invention.

The embodiments of the invention in which an exclusive property or privilege is claimed are defined as follows:

1. A logic circuit comprising, a tunnel diode exhibiting two stable operating conditions, bias means connected to said tunnel diode to provide bistable operation thereof, input means for providing input signals having two different levels, coupling means connected to said input means and to said tunnel diode, said coupling means including a diode which is relatively nonconducting in response to either level of an input signal thereby to isolate said tunnel diode from said input means, charge storage means connected to said coupling means and adapted to store charge therein in response to one level of said input signal, signal supplying means connected to said charge storage means for providing reverse current in said charge storage means subsequent to the storage of charge therein such that a large current is passed to said tunnel diode via said diode in said coupling means whereby said tunnel diode is switched from one operating state to the other, potential clamping means connected to said signal supplying means such that the potential at said charge storage means does not vary significantly in the absence of storage charge therein, and output means connected to said tunnel diode for detecting the operating condition thereof.

2. A non-inverting logic circuit comprising, at least one input means for supplying input signals having two different levels, a bistable device exhibiting negative resistance characteristics between different stable operating regions, a first current source connected to said bistable device to bias said device for bistable operation, unilaterally conducting means connected between said bistable device and said input means, a second current source, first charge storage means series connected between said second current source and said input means, said first charge storage means exhibiting charge storing capabilities only when said input signal has one level but not when said input signal has a different level, second charge storage means connected to said second current source and exhibiting charge storing capabilities only when said first charge storage means is not storing charge therein, and a source of periodic pulses connected to said first and second charge storage means for alternatively causing reverse current in one of said charge storage means subsequent to the storage of charge therein.

3. A non-inverting logic circuit comprising, at least one input means for supplying input signals having two different levels, a bistable device exhibiting negative resistance characteristics between different stable operating regions, a first current source connected to said bistable device to bias said device for bistable operation, unilaterally conducting means connected between said bistable device and said input means, a second current source, first charge storage means connected between said second current source and said input means, said first charge storage means exhibiting charge storing capabilities only when said input signal has one level but not when said input signal has a different level, second charge storage means connected to said second current source and exhibiting charge storing capabilities only when said first charge storage means is not storing charge therein, a source of periodic pulses connected to said first and second charge storage means for alternatively causing reverse current in one of said charge storage means subsequent to the storage of charge therein such that current is supplied to said bistable device via said first charge storage means and said unilaterally conducting means to switch said bistable device from one stable operating region to a different stable operating region, and output means connected to said bistable device.

4. A logic circuit comprising, a tunnel diode exhibiting two stable operating conditions, bias means connected to said tunnel diode to provide bistable operation thereof, a plurality of input means for providing input signals having two different levels, separate coupling means connected to each of said input means and to said tunnel diode, said coupling means including a diode which is relatively nonconducting in response to either level of an input signal, separate charge storage means connected to each of said coupling means and adapted to store charge therein in response to one level of said input signal, signal supplying means connected to each of said charge storage means for providing reverse current in any of said charge storage means having charge stored therein such that a large current is passed to said tunnel diode via the associated one of said diodes in said coupling means whereby said tunnel diode is switched from one stable operating state to the other, potential clamping means connected to said signal supplying means such that the potential at each of said charge storage means does not vary significantly in the absence of stored charge therein, and output means connected to said tunnel diode for detecting the operating condition thereof.

5. In combination, a plurality of input means, a tunnel diode exhibiting two stable operating states, bias means connected to said tunnel diode for biasing said tunnel diode for bistable operation, a diode connected between said input means and said tunnel diode, a current sink, a charge storage diode connected between said current sink and said input means, a clamping diode connected to a reference and to said current sink and said charge storage diode, pulse supplying means connected to said clamping diode and said charge storage diode for providing reverse current pulses through said charge storage diode when charge has been stored therein, output means connected to said tunnel diode, and means connected to said tunnel diode for periodically biasing said tunnel diode to one of its stable operating states.

6. A logic circuit comprising, a tunnel diode exhibiting two stable operating conditions, first bias means connected to said tunnel diode to provide bistable operation thereof, a plurality of input means connected together to form a plurality of AND gates, each of said AND gates providing signals having alternatively one of two different levels in accordance with the levels of signals supplied by said input means, a first plurality of diodes having at least two electrodes, each of said diodes respectively having one electrode connected to a different AND gate and another electrode connected to a common junction to form an OR gate, said OR gate providing a signal having alternatively one of two different levels in accordance with the levels of the signals supplied by said AND gates, second bias means connected to said one electrode of each of said diodes for biasing said diodes to a low conducting condition, constant current source means connected to said common junction, coupling means connected to said common junction and to said tunnel diode, said coupling means including a diode which is normally relatively nonconducting, charge storage means connected to said common junction, said constant current source means providing forward current to said charge storage means to store charge therein only in response to one level of said signal provided by said OR gate and providing current to selective ones of said first plurality of diodes only in response to one level of said signal provided by the associated AND gate, signal supplying means for providing reverse current in said charge storage means subsequent to charge storage therein such that a large current is passed to said tunnel diode by said diode in said coupling means whereby said tunnel diode is switched from one operating state to the other, potential clamping means connected to said signal supplying means such that the potential at said charge storage means does not vary significantly in the absence of stored charge therein, and output means connected to said tunnel diode for detecting the operating condition thereof.

7. In combination, a plurality of input means, each of said input means providing input signals having two separate levels, a tunnel diode exhibiting two stable operating states, bias means connected to said tunnel diode for biasing said tunnel diode for bistable operation, a separate diode connected between each of said input means and said tunnel diode, a current sink, a separate charge storage diode connected between said current sink and each of said input means, said charge storage diodes operative to store charge therein only when said input means provides input signals having one level, a potential clamping means connected to said current sink and said charge storage diode, pulse supplying means connected to said potential clamping means and each of said charge storage diodes for selectively providing reverse current pulses through each of said charge storage diodes when charge has been previously stored therein, said reverse current pulses being applied to said tunnel diode via at least one of said separate diodes to switch the operating state of said tunnel diode, output means connected to said tunnel diode, and means connected to said tunnel diode for periodically biasing said tunnel diode to one of its stable operating states.

8. The combination recited in claim 7 wherein said potential clamping means comprises a further charge storage diode, said further charge storage diode conducting forward current and storing charge when said input signals have another level, said further charge storage diode conducting reverse current in response to a pulse from said pulse supplying means when charge is stored in said further charge storage diode.

9. A logic circuit comprising, a tunnel diode exhibiting two stable operating conditions, first bias means connected to said tunnel diode to provide bistable operation thereof, a plurality of input means connected together to form a plurality of AND gates, each of said AND gates providing signals having alternatively one of two different levels, a first plurality of diodes, each of said diodes respectively having one electrode connected to a different AND gate and another electrode connected to a common junction to form an OR gate, said OR gate providing signals having alternatively one of two different levels in accordance with the signals provided by said AND gates, second bias means connected to said one electrode of each of said diodes for biasing said diodes to a low conducting condition, a coupling diode connected to said common junction and to said tunnel diode, charge storage means connected to said common junction, current supplying means connected to provide current to and store charge in said charge storage means only when said OR gate provides a signal having a predetermined one level, signal supplying means producing regularly recurring signals for providing reverse current in said charge storage means after the previous storage of charge therein such that a large current is passed to said tunnel diode by said diode in said coupling means whereby said tunnel diode is switched from one operating state to the other, potential clamping means connected to said signal supplying means such that the potential at said charge storage means does not vary significantly in the absence of stored charge therein, output means connected to said tunnel diode for detecting the operating condition thereof, and means for reswitching said tunnel diode to said one operating state from said other operating state.

10. A non-inverting logic circuit comprising, at least one input gate means for supplying input signals having a high level and a low level, a bistable tunnel diode exhibiting negative resistance characteristics between different stable operating regions, a first current source connected to said bistable tunnel diode to bias said device for bistable operation, diode means having an anode and a cathode, the cathode of said diode means connected to said bistable tunnel diode and the anode of said diode means connected to said input gate means, a second current source, first charge-storage diode means having the cathode thereof connected to said second current source and the anode thereof connected to said input gate means, said first charge storage diode means exhibiting charge storing capabilities only when said input signal exhibits said high level, second charge storage diode means connected to said second current source and exhibiting charge storing capabilities only when said input signal exhibits said low level and said first charge storage diode means is not storing charge therein, and a source of periodic pulses connected to said first and second charge storage diode means for alternatively causing reverse current in one of said charge storage means subsequent to the storage of charge therein.

11. In combination, a plurality of input means for supplying an input signal having first and second levels, a tunnel diode exhibiting two stable operating states, substantially constant current bias means connected to said tunnel diode for biasing said tunnel diode for bistable operation, isolating means connected to said input means, a coupling diode connected between said isolating means and said tunnel diode, said coupling diode isolating said tunnel diode from said input means, a current sink, a charge storage diode connected between said current sink and said isolating means for storing charge when said input signal has said first level, clamping means connected to said current sink and said charge storage diode, said clamping means preventing the spurious storage of charge in said charge storage diode when said input has said second level, pulse supplying means connected to said clamping means and said charge storage diode for providing reverse current pulses through said charge storage diode when charge has been stored therein, said reverse current pulses having fast rise times such that said isolating means exhibits high impedance thereto whereby said reverse current pulses are applied to said tunnel diode via said coupling diode to switch said tunnel diode to one of said two stable operating states, output means connected to said tunnel diode, and means connected to said tunnel diode for periodically biasing said tunnel diode to the other of its two stable operating states.

12. The combination recited in claim 11, wherein said clamping means comprises a further charge storage diode, said further charge storage diode storing charge therein except when said input signal has said first level, and passing reverse current in response to a pulse from said pulse supplying means subsequent to charge storage in said further diode.

References Cited by the Examiner

UNITED STATES PATENTS

| | | | |
|---|---|---|---|
| 2,908,830 | 10/1959 | Mason et al. | 307—88.5 |
| 3,001,087 | 9/1961 | Harloff | 307—88.5 |
| 3,103,602 | 9/1963 | Holmes et al. | 307—88.5 |
| 3,106,644 | 10/1963 | Retzinger | 307—88.5 |
| 3,112,453 | 11/1963 | Holt | 307—88.5 |
| 3,117,240 | 1/1964 | Clapper | 307—88.5 |
| 3,155,841 | 11/1964 | Okuda | 307—88.5 |

FOREIGN PATENTS

| | | | |
|---|---|---|---|
| 162,722 | 5/1955 | Australia | 307—88.5 |

ARTHUR GAUSS, *Primary Examiner.*

JOHN W. HUCKERT, *Examiner.*